US010239212B2

(12) United States Patent
Chuang et al.

(10) Patent No.: US 10,239,212 B2
(45) Date of Patent: Mar. 26, 2019

(54) ULTRASONIC TACTILE SENSOR FOR DETECTING CLAMPING FORCE (71) Applicant: SOUTHERN TAIWAN UNIVERSITY OF SCIENCE AND TECHNOLOGY, Tainan (TW)

(72) Inventors: Cheng Hsin Chuang, Tainan (TW); Jia Wun Chen, Tainan (TW)

(73) Assignee: Southern Taiwan University of Science and Technology, Tainan (TW)

(*) Notice: Subject to any disclaimer, the term of this patent is extended or adjusted under 35 U.S.C. 154(b) by 148 days.

(21) Appl. No.: 15/288,027

(22) Filed: Oct. 7, 2016

(65) Prior Publication Data

US 2018/0099414 A1  Apr. 12, 2018

(51) Int. Cl.
  *B25J 13/08*  (2006.01)
  *H01L 41/053*  (2006.01)
  *H01L 41/113*  (2006.01)
  *H01L 41/193*  (2006.01)
  *H01L 41/25*  (2013.01)
  *G01L 1/16*  (2006.01)

(52) U.S. Cl.
  CPC .......... *B25J 13/084* (2013.01); *G01L 1/165* (2013.01); *H01L 41/053* (2013.01); *H01L 41/1132* (2013.01); *H01L 41/193* (2013.01); *H01L 41/25* (2013.01)

(58) Field of Classification Search
  CPC .......... B25J 13/084; G01L 1/14; G01L 1/165; G01L 25/00; H01L 41/053; H01L 41/1132; H01L 41/193; H01L 41/25; H01L 41/253
  USPC .................................................... 73/862.625
  See application file for complete search history.

(56) References Cited

U.S. PATENT DOCUMENTS

| 9,132,574 | B2* | 9/2015 | Chuang | B29C 41/14 |
| 9,170,668 | B2* | 10/2015 | Schneider | G06F 3/041 |
| 9,259,961 | B2* | 2/2016 | Wong | B60B 1/02 |
| 9,323,393 | B2* | 4/2016 | Djordjev | G06K 9/0002 |
| 9,411,457 | B2* | 8/2016 | Perlin | G06F 3/005 |
| 9,817,108 | B2* | 11/2017 | Kuo | G01S 7/52017 |
| 9,904,428 | B2* | 2/2018 | Schardt | G06F 3/044 |
| 2002/0045028 | A1* | 4/2002 | Teshima | B32B 3/08 |
|  |  |  |  | 428/156 |
| 2016/0221316 | A1* | 8/2016 | Yairi | B32B 27/40 |

* cited by examiner

Primary Examiner — Jonathan Dunlap
Assistant Examiner — Octavia Hollington
(74) Attorney, Agent, or Firm — Rosenberg, Klein & Lee (57) ABSTRACT An ultrasonic tactile sensor for detecting a clamping force includes an ultrasonic detector and a sensing layer, and the sensing layer includes a first soft layer and a second soft layer, and the first soft layer has plural spherical microstructures arranged in contact with the ultrasonic detector, so that after a pressure is applied to the sensing layer, the ultrasonic detector generates an ultrasonic wave and receives a reflected wave signal, and the signal is provided for identifying the contact area of the spherical microstructures and deriving the force exerted on the tactile sensor.

7 Claims, 8 Drawing Sheets

| Model | | | |
|---|---|---|---|
| Contact Area | 0 μm | 200μm | 400μm |
| Model | | | |
| Contact Area | 600μm | 800μm | 900μm |

ULTRASONIC TACTILE SENSOR FOR DETECTING CLAMPING FORCE

FIELD OF THE INVENTION

The present invention relates to a tactile sensor, in particular to the tactile sensor for detecting a clamping force of robotic arms.

BACKGROUND OF THE INVENTION

Description of the Related Art

According to the International Federation of Robotics, data show that robotic arms are used extensively in the field of industrial automation. Since the application of the robotic arms can reduce or eliminate unpredictable human errors that adversely affect the precision and durability of a product, therefore the demand for robotic arms in different industries becomes increasingly larger. However, most of the industrial robotic arms primarily use vision for detection and are lack of a feedback mechanism for the tactile sensing, thus causing blind spots of the visual sensing and errors on determining distance easily, and resulting in a wrong judgment or determination of fetching made by the sensor of the robotic arm.

To overcome the aforementioned drawback, R.O.C. Pat. No. I283295 discloses a piezoelectric touch sensor comprising a lower substrate, a lower electrode layer, a piezoelectric material layer, at least one electrode layer and an upper substrate combined sequentially with one another, wherein at least one of the lower substrate, the piezoelectric material layer, and the upper substrate is a pressure boosting layer, and at least a convex structure is disposed between the pressure boosting layer and the lower electrode layer or the upper electrode layer, so that when an external stress is applied to the upper electrode layer, the convex structure conveys the pressure to the piezoelectric material to improve the sensitivity of the external stress. In addition, R.O.C. Pat. Publication No. 201416652 discloses a "pressure sensing device and clamping device applying the same" comprising a protrusion combined with a side of a sensing layer, so that the parallel sectional area of the protrusion becomes increasingly smaller and the protrusion is parallel to the pressure sensing layer. When pressure is transmitted from the protrusion to the pressure sensing layer, the pressure is concentrated at the tip of the protrusion to improve the sensitivity of the pressure detection and amplify the detected pressure signal. R.O.C. Pat. No. I408036 discloses a "thin-sheet tactile sensing system" comprising a plurality of vertical stress detection units, and a thin-sheet portion comprised of an external thin-sheet layer, a force detection thin-sheet layer, and a medium layer, and both of the external thin-sheet layer and the force detection thin sheet layer have a plurality of protrusions protruded in opposite directions to one another, and the vertical stress detection unit has a center detection element and an edge detection element, so that the tactile detection system can detect the vertical stress and shear force when contacting an object. R.O.C. Pat. No. I444604 discloses a "flexible piezoelectric tactile sensor" comprising a first flexible substrate and a second flexible substrate disposed on upper and lower surfaces of a piezoelectric film respectively, and the first flexible substrate has a plurality of first electrodes electrically coupled to the piezoelectric film, and the second flexible substrate has a plurality of second electrodes, and a flexible body is installed on a surface of the first flexible substrate corresponsive to the first electrode, so that the manufacturing cost of the tactile sensor can be reduced.

In addition, U.S. Pat. USRE37065 discloses a sensor, wherein a hemispherical target is disposed on a surface of a soft matter, and a piezoelectric ultrasonic transducer is installed at the bottom of the sensor and provided for transmitting an ultrasonic signal, and reflecting the signal to a piezoelectric film by the hemispherical target to obtain another signal, so as to calculate a multi-axial force exerted on the surface according to the deformation by the target. U.S. Pat. No. US20080258580 discloses a piezoelectric imaging array device comprising acoustic waveguide array and a piezoelectric array device related to the arrangement of the acoustic waveguide array, and the piezoelectric array device can provide ultrasonic energy of ultrasonic or waveguide array set waveform and receive the ultrasonic energy of the reflected wave or set waveform of the waveguide array, and the array device receives the energy reflected from a living organism, and such device can be used for scanning fingerprint images. U.S. Pat. No. 7,511,702 discloses a force and position sensing display comprising a force and tactile sensing assembly, and the sensing assembly has a first conductive circuit and a second conductive circuit installed on surfaces of the first transparent layer and the second transparent layer respectively, and a plurality of deformable components installed between the first transparent layer and the second transparent layer, so that when the sensing assembly is abutted against the display unit, the sensor provides the function of sensing both position and force.

In a conventional tactile sensor, the functions of detecting the lateral shear strength, the roughness of the surface of the contact object, the initial slide and the tactile shape can be sensed in addition to the detection of the contact force exerted on a crawling object. Although the conventional tactile sensors can detect a clamping force by different principles, the manufacturing process of these tactile sensors is more complicated. In addition, the present thin sensor available in the market is unable to reflect the reading and lack of sensitivity and resolution.

Summary of the Invention

In view of the drawbacks of the conventional sensors such as the complicated manufacturing process, high cost, and lacking of sensitivity and resolution, it is a primary objective of the present invention to use a spherical microstructure as a sensing element and an ultrasonic sensing to analyze the pressure exerted on the sensing element and feed back the shape, and such application is applied to a robotic arm for precision fetching and assembling while achieving the effect of ensuring the quality and safety management of the object.

To achieve the aforementioned objective, the present invention provides an ultrasonic tactile sensor for detecting a clamping force comprising: an ultrasonic detector, for detecting a sensing layer contact area to derive a force exerted on the tactile sensor, and further comprising: a piezoelectric film emitting layer (Tx), for exciting an ultrasonic shock wave; a piezoelectric film receiving layer (Rx), for sensing and reflecting a piezoelectric signal excited by the wave; a glass layer, bound between the piezoelectric film emitting layer and the piezoelectric film receiving layer, for capturing a signal of the piezoelectric film receiving layer; and a packaging layer, bound with the top of the piezoelectric film receiving layer; and a sensing layer, including a first soft layer and a second soft layer, and the first soft layer having a plurality of spherical microstructures arranged to be in contact with the packaging layer of the ultrasonic detector, and the second soft layer being bound between the packaging layer and the first soft layer, and the first soft layer having a hardness greater than the hardness of the second soft layer.

After pressure is exerted on the tactile sensor, a frequency is inputted by the piezoelectric film emitting layer to excite vibration to produce ultrasound, so that a force is transmitted from the second soft layer to the first soft layer by a spherical microstructure, and the piezoelectric film receiving layer is provided for receiving the reflected wave signal, and the signal is used to identify the contact area of the spherical microstructure, so as to calculate and derive the magnitude of force exerted on the tactile sensor, and such tactile sensor can be used for touch control and the force feedback of the robotic arm.

BRIEF DESCRIPTION OF THE DRAWINGS

FIGS. 5-a~6 are schematic views showing the results of simulated ultrasonic reflection of the present invention;
and
FIGS. 7-a~9 are schematic views showing the actual experiment results of the present invention.

DESCRIPTION OF THE PREFERRED EMBODIMENTS

The above and other objects, features and advantages of this disclosure will become apparent from the following detailed description taken with the accompanying drawings.

Figure 1:
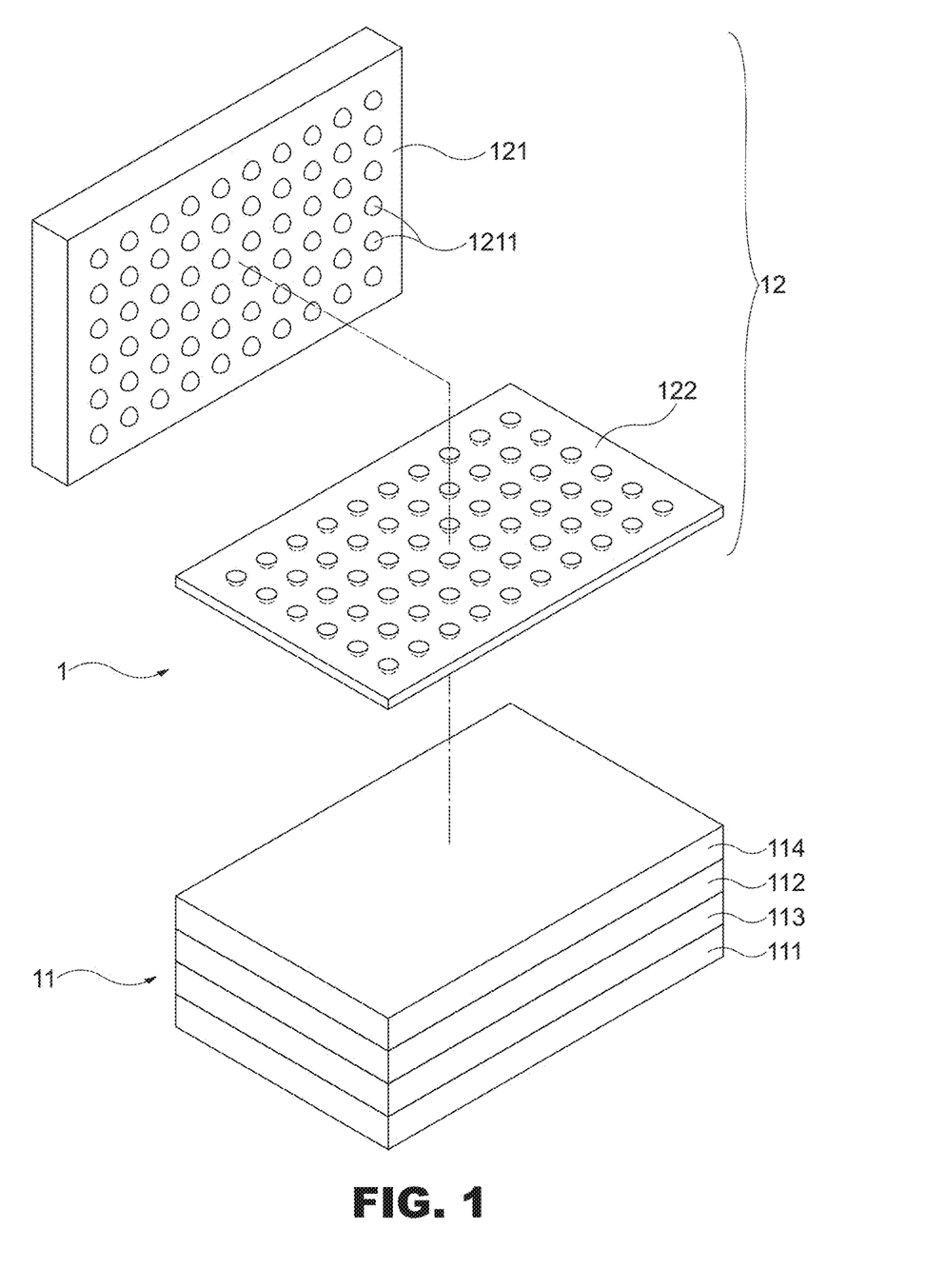
FIG. 1 is an exploded view of the present invention.
Figure 2:
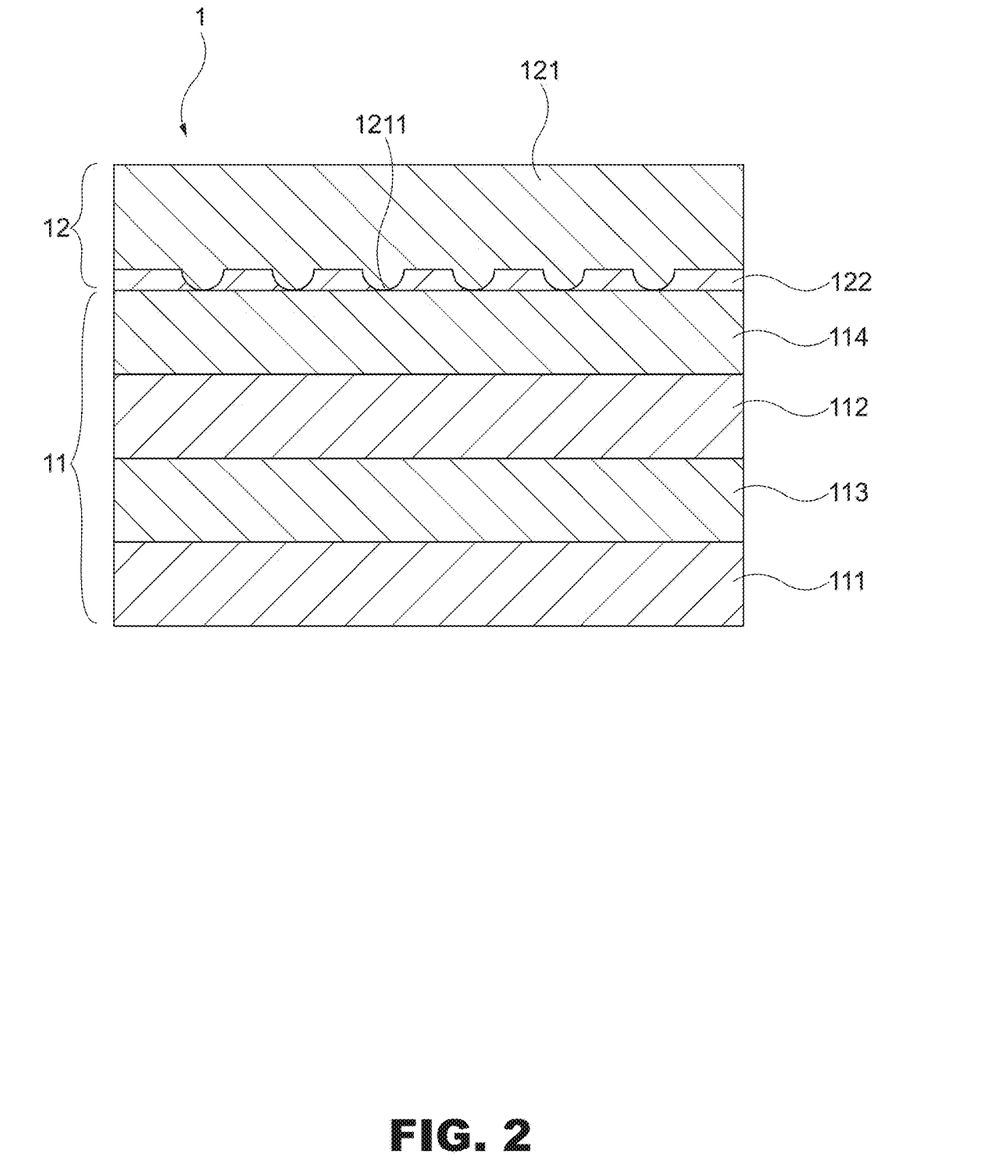
FIG. 2 is a cross-sectional view of the present invention.

With reference to FIGS. 1 and 2 for an ultrasonic tactile sensor of the present invention, the ultrasonic tactile sensor 1 comprises an ultrasonic detector 11 and a sensing layer 12. Wherein, the ultrasonic detector 11 is provided for detecting the contact area of a first soft layer 121 of a sensing layer 12 to derive the force exerted on the tactile sensor 1, and the ultrasonic detector 11 further comprises a piezoelectric film emitting layer (Tx) 111, a piezoelectric film receiving layer (Rx) 112, a glass layer 113 and a packaging layer 114, wherein the piezoelectric film emitting layer 111 is provided for exciting ultrasonic shock waves, and the piezoelectric film emitting layer 111 is preferably made of polyvinylidene fluoride (PVDF); the piezoelectric film receiving layer (Rx) 112 is provided for sensing a piezoelectric signal excited by the reflected wave, and the piezoelectric film receiving layer 112 is preferably made of polyvinylidene fluoride (PVDF); the glass layer 113 is bound between the piezoelectric film emitting layer 111 and the piezoelectric film receiving layer 112 and provided for capturing a signal of the piezoelectric film receiving layer 112 and the glass layer 113 is preferably made of Thin-Film Transistor (TFT) glass, and an adhesive layer 115(116) (not shown in the figure) is disposed between the glass layer 113 and the piezoelectric film emitting layer 111 and between the glass layer 113 and the piezoelectric film receiving layer 112; the packaging layer 114 is bound to the top of the piezoelectric film receiving layer 112, and the packaging layer 114 is preferably made of polymethyl methacrylate (PMMA). The sensing layer 12 comprises a first soft layer 121 and a second soft layer 122, and the first soft layer 121 has a plurality of spherical microstructures 1211 arranged thereon, so that the spherical microstructure 1211 is in contact with the packaging layer 114 of the ultrasonic detector 11, and the second soft layer 122 is bound between the packaging layer 114 and the first soft layer 121, and the first soft layer 121 has a hardness greater than the hardness of the second soft layer 122, and the sensing layer 12 is preferably made of polydimethylsiloxane (PDMS).

Figure 3:
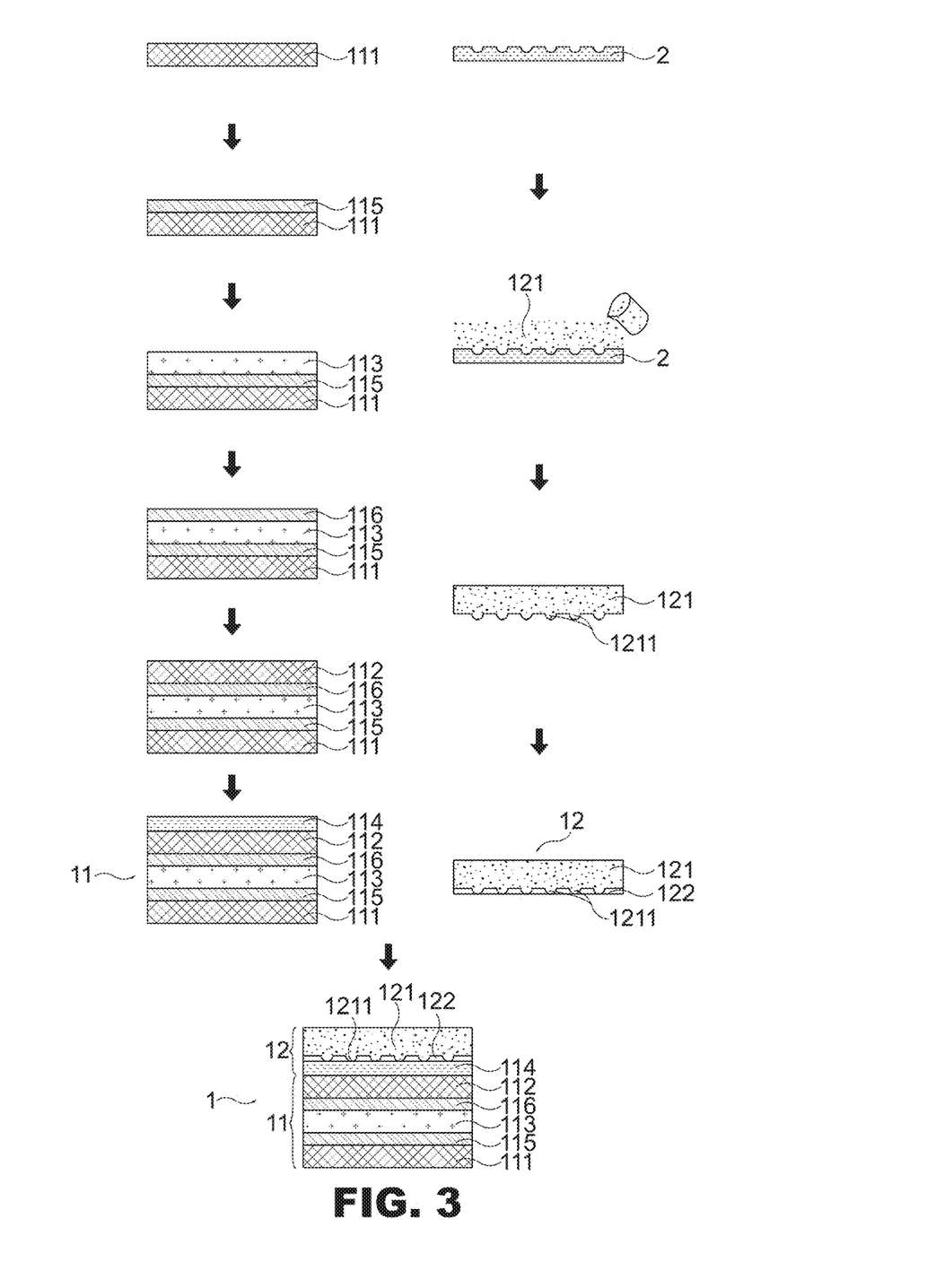
FIG. 3 is a manufacturing flow chart of the present invention.

With reference to FIG. 3 for a manufacturing method of a tactile sensor 1 of the present invention, the method comprises the steps of: cutting a piezoelectric film (PVDF) into an appropriate size to form the piezoelectric film emitting layer (Tx) 111; spraying an adhesive onto the top of the piezoelectric film emitting layer 111 to form the adhesive layer 115; covering the glass layer 113 made of TFT glass onto the adhesive layer 115; spraying an adhesive onto the glass layer 113 to form the adhesive layer 116; covering the piezoelectric film receiving layer (Rx) 112 made of piezoelectric film (PVDF) onto the top of the adhesive layer 116; and finally coating PMMA onto the piezoelectric film receiving layer 112 to form the packaging layer 114, so as to form the complete ultrasonic detector 11. The sensing layer 12 is manufactured into an acrylic mold core 2 made by molding technology, and then PDMS is filled into the mold core 2, and the mold is baked and cured before demolding to form the first soft layer 121 with a plurality of array spherical microstructures 1211, and then the second soft layer 122 is covered onto the spherical microstructure 1211 to form the sensing layer 12, and the sensing layer 12 is adhered to the top of the packaging layer 114 of the ultrasonic detector 11 to complete the tactile sensor 1.

Figure 4:
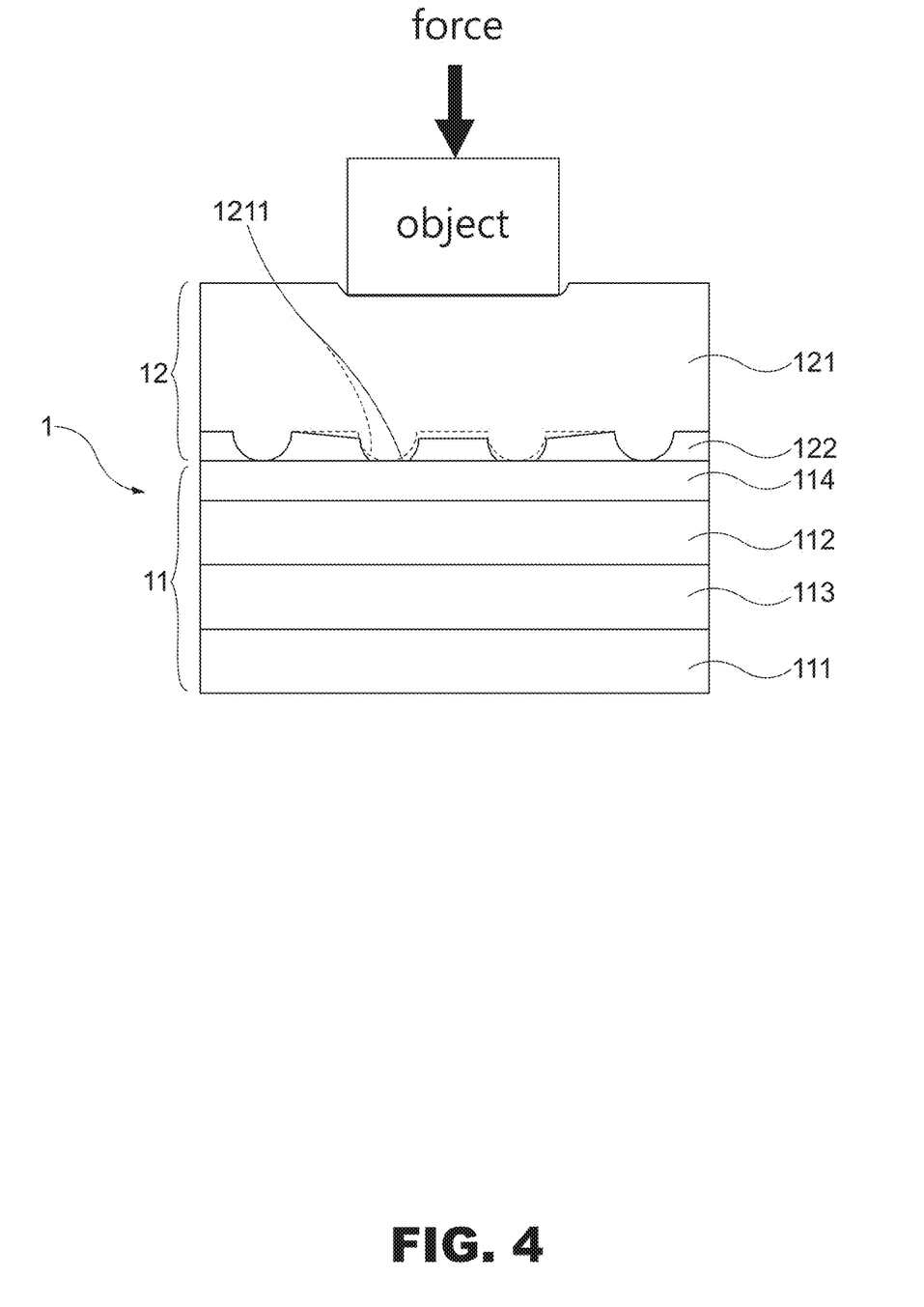
FIG. 4 is a schematic view of an application of the present invention.

In FIG. 4, the sensing layer 12 is deformed after pressure is exerted onto the tactile sensor 1 (as indicated by the arrow of the figure). Now, the second soft layer 122 exerts the pressing force onto the sensing layer 12 uniformly, so that the spherical microstructures 1211 of the first soft layer 121 will not produce different shaped contact areas due to non-uniform pressure. Since the contact area of the sensing layer 12 is directly proportional to the external applied force, therefore the inputted frequency at the piezoelectric film emitting layer 111 of the ultrasonic sensor 11 can be used for exciting vibrations to produce ultrasounds. When a static forward force is applied to the ultrasonic sensor 11, the force will be transmitted from the second soft layer 122 to the spherical microstructures 1211 of the first soft layer 121, so that the area of the spherical microstructure 1211 in contact with the packaging layer 114 is increased, and the piezoelectric film receiving layer 112 receives the reflected wave signal after the spherical microstructures 1211 are deformed, and the signal is provided for indentifying the contact area of the spherical microstructure 1211 with the packaging layer 114, in order to calculate the pixels of the contact area to derive the tactile sensor 1.

Figure 5A:
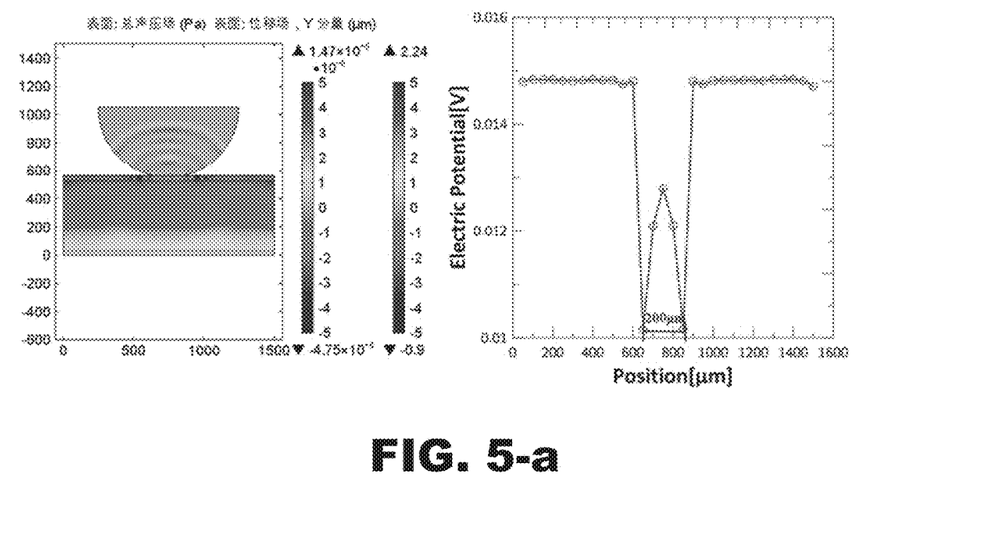
Figure 5B:
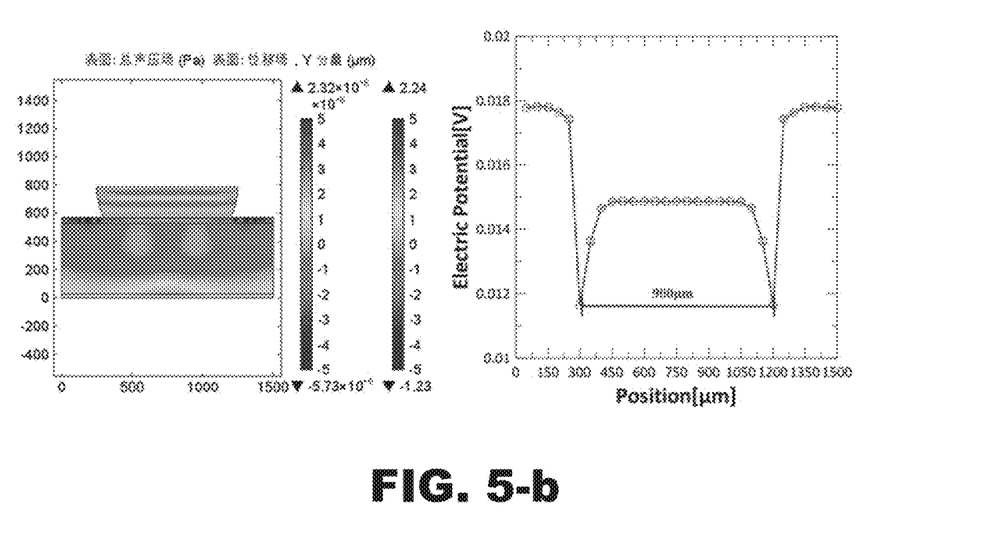
Figure 6:
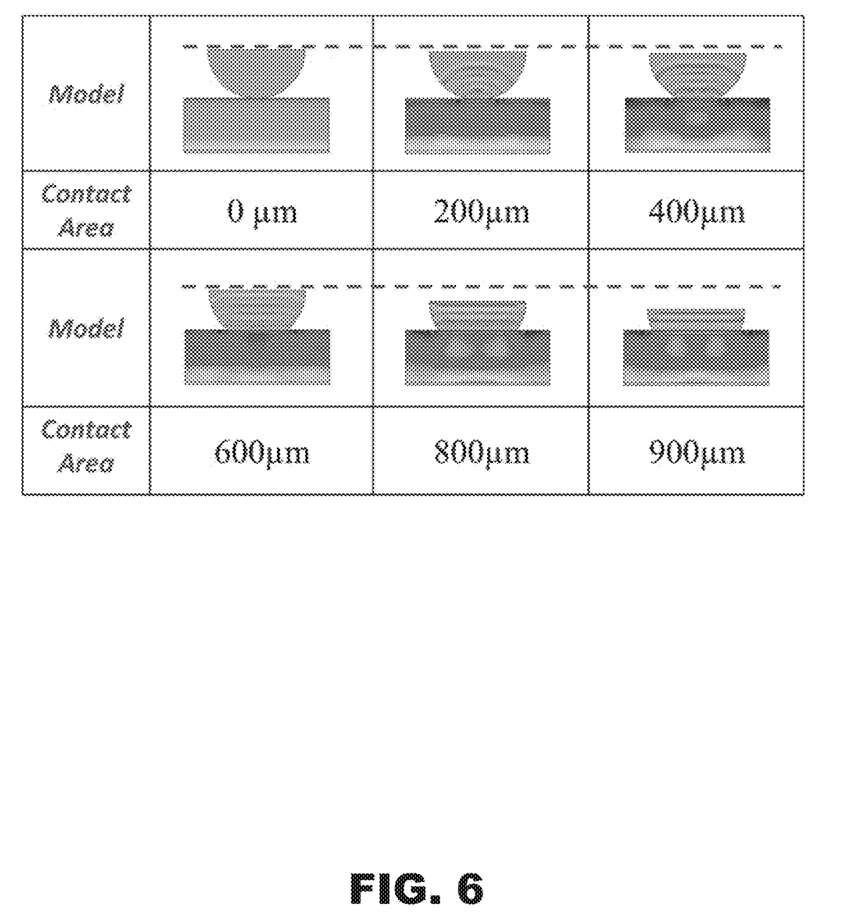

To understand the reflection produced by the sensing layer 12 after the ultrasonic sensor 11 excites vibration, the inventor of the present invention makes a simulation in an experiment, and the glass layer 113 of the ultrasonic sensor 11 is set to 500 μm, and a contact area of 200 μm (as shown in FIG. 5-a) and a contact area of 900 μm (as shown in FIG. 5-b) are formed between the spherical microstructure 1211 of the first soft layer 121 and the ultrasonic sensor 11 respectively, and then the piezoelectric film emitting layer (Tx) 111 of the ultrasonic sensor 11 is excited by a frequency of 10 MHz to produce ultrasound. After the ultrasound is transmitted to the sensing layer 12 and reflected, the piezoelectric film receiving layer 112 of the ultrasonic sensor 11 captures the reflected wave, and the simulated experiment result shows that the greater the contact area of the spherical microstructures 1211 with the ultrasonic sensor 11, the greater the reflected range of the reflected wave (as shown in FIG. 6).

Figure 7A:
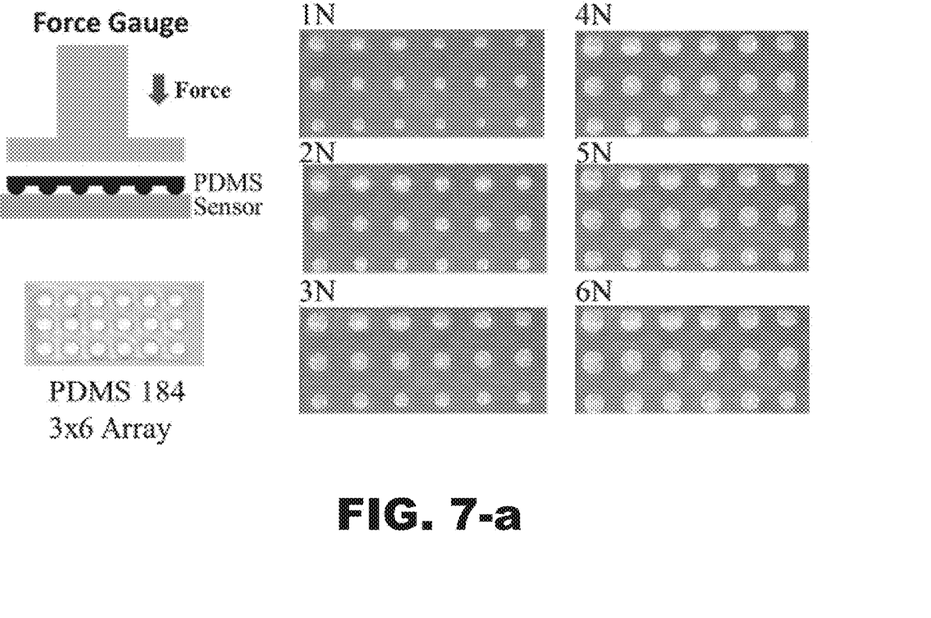
Figure 7B:
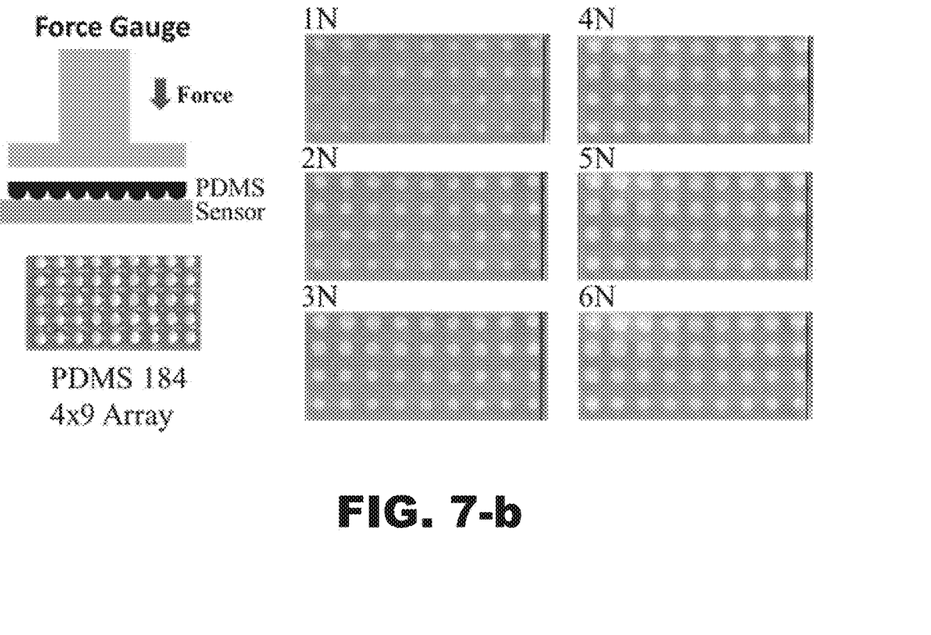
Figure 8:
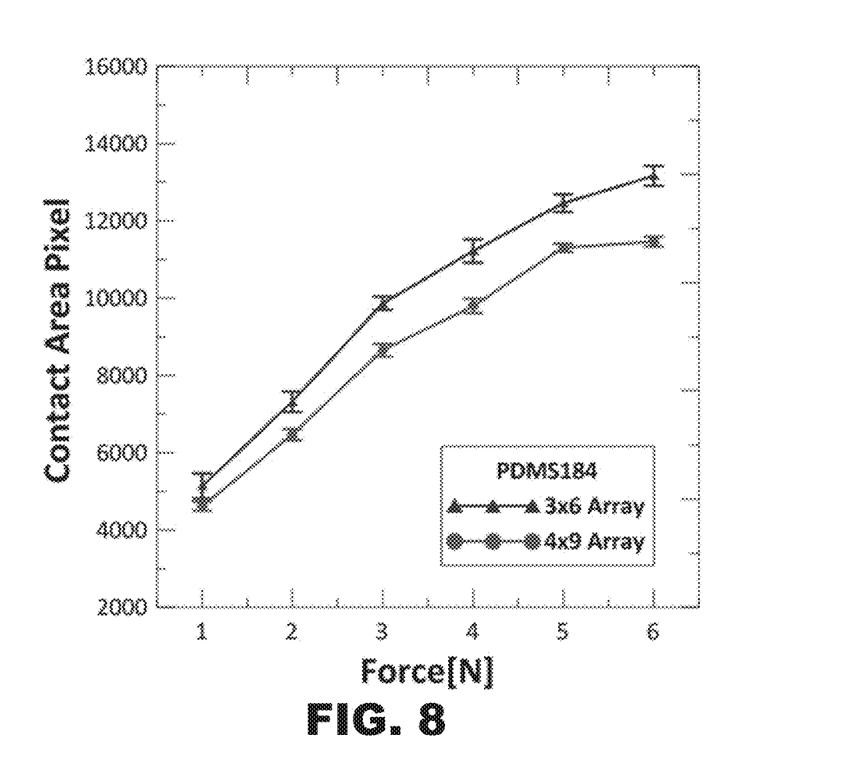
Figure 9:
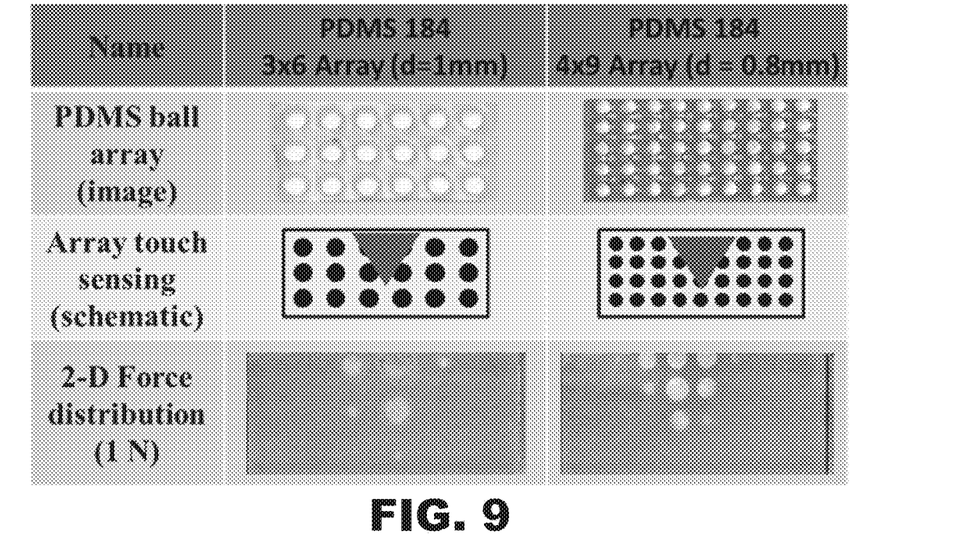

In addition, the inventor of the present invention based on the aforementioned structure and sensing principle to perform the actual experiments, wherein the spherical microstructures 1211 of the first soft layer 121 are arranged into a 3×6 array (as shown in FIG. 7-*a*) and a 4×9 array (as shown in FIG. 7-*b*), and a pressure of 1~6N (Newton) is applied to the first soft layers 12 of the 3×6 array and 4×9 array 1 separately, so that the contact areas between the spherical microstructure 1211 of the 3×6 array and the 4×9 array and the ultrasonic sensor 11 as shown by the gray-scale images as shown in FIGS. 7-*a* and 7-*b* respectively, and the gray-scale images are captured and the pixels of the contact area are calculated, and the calculated result shows that the greater the static force applied from 1N~6N, the greater the contact areas of the spherical microstructures 1211 of the sensing layer 12 with the ultrasonic sensor 11. The pixel value of the contact area and the applied force tend to rise linearly (as shown in FIG. 8). The greater the array number of the spherical microstructures 1211 of the first soft layer 121, the higher the resolution of the pixel of the spherical microstructures 1211 in contact with the ultrasonic sensor 11 (as shown in FIG. 9).

According to the aforementioned simulation and experiment result, the tactile sensor 1 of the present invention applied to a robotic arm is capable to achieve the effects of monitoring whether or not there is any damage in the clamping process and correcting the assembling path for smart assembling, ensuring the quality and safety of the object, and applying the tactile sensor for force feedback such as touch control or mobile phone touch control through the tactile sensor 1 of the clamping device and the contact force of the object.

What is claimed is:

1. An ultrasonic tactile sensor for detecting a clamping force, comprising:
   an ultrasonic detector, for detecting a sensing layer contact area to derive a force exerted on the tactile sensor, the ultrasonic detector including:
   a piezoelectric film emitting layer (Tx), for generating an ultrasonic shock wave;
   a piezoelectric film receiving layer (Rx), for sensing a piezoelectric signal excited by the ultrasonic shock wave reflected by the sensing layer contact area;
   a glass layer disposed between the piezoelectric film emitting layer and the piezoelectric film receiving layer, for capturing a signal of the piezoelectric film receiving layer; and
   a packaging layer disposed over a top of the piezoelectric film receiving layer; and
   a sensing layer including a first soft layer portion and a second soft layer portion each formed of a deformable material, the first soft layer portion having a plurality of spherical microstructures arranged to be in contact with the packaging layer of the ultrasonic detector, the spherical microstructures being deformable against the packaging layer to define the sensing layer contact area thereon responsive to a force applied to the sensing layer, the second soft layer portion being bound between the packaging layer and the first soft layer portion, the first soft layer portion being greater in hardness than the second soft layer portion.

2. The ultrasonic tactile sensor for detecting a clamping force according to claim 1, wherein the piezoelectric film emitting layer is made of polyvinylidene fluoride (PVDF).

3. The ultrasonic tactile sensor for detecting a clamping force according to claim 1, wherein the piezoelectric film receiving layer is made of polyvinylidene fluoride (PVDF).

4. The ultrasonic tactile sensor for detecting a clamping force according to claim 1, wherein the glass layer is made of thin-film transistor (TFT) glass.

5. The ultrasonic tactile sensor for detecting a clamping force according to claim 1, wherein the packaging layer is made of polymethyl methacrylate (PMMA).

6. The ultrasonic tactile sensor for detecting a clamping force according to claim 1, further comprising an adhesive layer disposed between the glass layer and the piezoelectric film emitting layer, and between the glass layer and the piezoelectric film receiving layer.

7. The ultrasonic tactile sensor for detecting a clamping force according to claim 1, wherein, the sensing layer is made of polydimethylsiloxane (PDMS).

* * * * *